(12) United States Patent
Xu et al.

(10) Patent No.: US 8,860,471 B2
(45) Date of Patent: Oct. 14, 2014

(54) ISOLATED GATE DRIVER ADAPTED FOR PWM-BASED SWITCHING POWER SUPPLY

(71) Applicants: Ming Xu, Nanjing (CN); Jing-Peng Zhu, Nanjing (CN); Ju-Lu Sun, Nanjing (CN); Zhang-He Nan, Nanjing (CN)

(72) Inventors: Ming Xu, Nanjing (CN); Jing-Peng Zhu, Nanjing (CN); Ju-Lu Sun, Nanjing (CN); Zhang-He Nan, Nanjing (CN)

(73) Assignees: FSP Technology Inc., Taoyuan County (TW); FSP-Powerland Technology Inc., Nanjing (CN)

( * ) Notice: Subject to any disclaimer, the term of this patent is extended or adjusted under 35 U.S.C. 154(b) by 0 days.

(21) Appl. No.: 13/624,964

(22) Filed: Sep. 23, 2012

(65) Prior Publication Data
US 2013/0076406 A1 Mar. 28, 2013

(30) Foreign Application Priority Data
Sep. 23, 2011 (CN) .......................... 2011 1 0285731

(51) Int. Cl.
| | | |
|---|---|---|
| *H03K 3/00* | (2006.01) | |
| *H03K 17/691* | (2006.01) | |
| *H02M 1/08* | (2006.01) | |
| *H03K 17/16* | (2006.01) | |
| *H02M 1/32* | (2007.01) | |
| *H03K 17/0812* | (2006.01) | |

(52) U.S. Cl.
CPC .............. *H02M 1/08* (2013.01); *H03K 17/691* (2013.01); *H03K 17/161* (2013.01); *H02M 1/32* (2013.01); *H03K 17/08122* (2013.01)
USPC .......................................... 327/109; 327/108

(58) Field of Classification Search
CPC ...................................... H03K 17/691
USPC .............................................. 327/109
See application file for complete search history.

(56) References Cited

U.S. PATENT DOCUMENTS

| | | | | |
|---|---|---|---|---|
| 4,527,228 A * | 7/1985 | Chi Yu | ............................ | 363/98 |
| 4,748,351 A * | 5/1988 | Barzegar | ........................ | 327/384 |
| 5,438,294 A * | 8/1995 | Smith | ........................... | 327/384 |
| 5,481,219 A * | 1/1996 | Jacobs et al. | ................... | 327/434 |
| 5,896,279 A * | 4/1999 | Lin | ............................. | 363/21.11 |
| 6,144,193 A * | 11/2000 | Illingworth | .................... | 323/284 |
| 7,113,412 B2 * | 9/2006 | Shao et al. | .................... | 363/18 |
| 2004/0145920 A1* | 7/2004 | Xu et al. | ........................ | 363/17 |
| 2004/0257837 A1* | 12/2004 | Xu et al. | ..................... | 363/21.04 |
| 2011/0101877 A1* | 5/2011 | Zhan et al. | ..................... | 315/206 |
| 2012/0008344 A1* | 1/2012 | Zeng et al. | ................. | 363/21.11 |
| 2012/0039098 A1* | 2/2012 | Berghegger | ............... | 363/21.13 |

* cited by examiner

*Primary Examiner* — Ryan Jager
(74) *Attorney, Agent, or Firm* — Jianq Chyun IP Office

(57) ABSTRACT

An isolated gate driver including a driving control circuit, an isolated transformer, an anti-circuit and a secondary processing circuit is provided. The driving control circuit is configured to generate a driving PWM signal for driving a power switch tube. The isolated transformer has a primary winding and a secondary winding. The anti-circuit is connected between the driving control circuit and the primary winding of the isolated transformer, and is configured to suppress a variation of an induced voltage in the secondary winding of the isolated transformer when a duty cycle of the driving PWM signal is sharply decreased. The secondary processing circuit is connected in parallel with the secondary winding of the isolated transformer, and is configured to perform a voltage clamping action on a gate-source voltage of the power switch tube when the duty cycle of the driving PWM signal is sharply decreased.

14 Claims, 6 Drawing Sheets

US 8,860,471 B2

ISOLATED GATE DRIVER ADAPTED FOR PWM-BASED SWITCHING POWER SUPPLY

CROSS-REFERENCE TO RELATED APPLICATION

This application claims the priority benefit of China application serial no. 201110285731.1, filed on Sep. 23, 2011. The entirety of the above-mentioned patent application is hereby incorporated by reference herein and made a part of this specification.

BACKGROUND OF THE INVENTION

1. Field of the Invention

The present invention relates to a gate driving technology, more particularly, to an isolated gate driver adapted for, for example, a PWM-based switching power supply.

2. Description of the Related Art

A conventional isolated gate driver 10 as shown in FIG. 1 generally includes an isolated transformer T1, and can be used to drive the high power MOSFET Q connected with the secondary winding LS of the isolated transformer T1 in response to a driving pulse-width-modulation (PWM) signal $V_{PWM}$. However, assuming that the turns ratio of the isolated transformer T1 is 1:1, so when the duty cycle of the driving PWM signal $V_{PWM}$ is smaller, the induced voltage VS (i.e. (1−D)*Vcc1, where D is the duty cycle of the driving PWM signal $V_{PWM}$, and Vcc1 is the amplitude of the driving PWM signal $V_{PWM}$) in the secondary winding LS of the isolated transformer T1 is larger and may be greater than the maximum gate-source voltage (Vgs_max) of the high power MOSFET Q.

On the other hand, when the duty cycle (D) of the driving PWM signal $V_{PWM}$ is sharply decreased, the induced voltage VS in the secondary winding LS of the isolated transformer T1 is sharply varied with the sharp variation of the induced voltage VP in the primary winding LP of the isolated transformer T1 due to the resonance generated from the primary side of the isolated transformer T1. In this case, the induced voltage VS in the secondary winding LS of the isolated transformer T1 may be greater than the maximum gate-source voltage (Vgs_max) of the high power MOSFET Q when the driving PWM signal $V_{PWM}$ is in the high-level. Moreover, the high power MOSFET Q may be mistakenly turned on when the driving PWM signal $V_{PWM}$ is in the low-level. Obviously, the high power MOSFET Q cannot be reliably driven by the conventional isolated gate driver 10.

SUMMARY OF THE INVENTION

In order to solve the problems mentioned in the above "BACKGROUND OF THE INVENTION", an exemplary embodiment of the invention provides an isolated gate driver including a driving control circuit, an isolated transformer, an anti-circuit and a secondary processing circuit. The driving control circuit is configured to generate a driving pulse-width-modulation (PWM) signal for driving a power switch tube. The isolated transformer has a primary winding and a secondary winding. The anti-circuit is connected between the driving control circuit and the primary winding of the isolated transformer, and is configured to suppress a variation of an induced voltage in the secondary winding of the isolated transformer when a duty cycle of the driving PWM signal is sharply decreased. The secondary processing circuit is connected in parallel with the secondary winding of the isolated transformer, and is configured to perform a voltage clamping action on a gate-source voltage of the power switch tube when the duty cycle of the driving PWM signal is sharply decreased.

In an exemplary embodiment of the invention, the driving PWM signal is provided to a primary input interface, and the anti-circuit includes a first diode and a capacitor. An anode of the first diode is connected to one terminal of the primary winding of the isolated transformer, and a cathode of the first diode is connected to a first terminal of the primary input interface. The capacitor is connected in parallel with the first diode, and another terminal of the primary winding of the isolated transformer is connected to a second terminal of the primary input interface.

In an exemplary embodiment of the invention, the anti-circuit is further configured to filter out a DC component of the driving PWM signal.

In an exemplary embodiment of the invention, the secondary processing circuit includes a voltage clamping sub-circuit, and the voltage clamping sub-circuit includes a second diode, a first PNP-type BJT and a voltage-regulator diode. An anode of the second diode is connected to one terminal of the secondary winding of the isolated transformer and a gate of the power switch tube. An emitter of the first PNP-type BJT is connected to a cathode of the second diode, and a collector of the first PNP-type BJT is connected to another terminal of the secondary winding of the isolated transformer and a source of the power switch tube. An anode of the voltage-regulator diode is connected to the another terminal of the secondary winding of the isolated transformer, and a cathode of the voltage-regulator diode is connected to a base of the first PNP-type BJT.

In an exemplary embodiment of the invention, in case that the secondary processing circuit includes the voltage clamping sub-circuit, the secondary processing circuit may further include a discharging sub-circuit, and the discharging sub-circuit includes a third diode, a second PNP-type BJT and a fourth diode. An anode of the third diode is connected to the anode of the second diode, and a cathode of the third diode is connected to the gate of the power switch tube. An emitter of the second PNP-type BJT is connected to the cathode of the third diode, and a base of the second PNP-type BJT is connected to the anode of the third diode. An anode of the fourth diode is connected to a collector of the second PNP-type BJT, and a cathode of the fourth diode is connected to the another terminal of the secondary winding of the isolated transformer. The discharging sub-circuit is inactivated when the power switch tube is turned on. The discharging sub-circuit is activated when the power switch tube is turned off, so as to discharge charges stored in a parasitic capacitor between the gate and the source of the power switch tube.

In an exemplary embodiment of the invention, the secondary processing circuit includes second to fifth diodes, a voltage-regulator diode and a PNP-type BJT. A cathode of the second diode is connected to one terminal of the secondary winding of the isolated transformer. An anode of the third diode is connected to an anode of the second diode. A cathode of the voltage-regulator diode is connected to a cathode of the third diode, and an anode of the voltage-regulator diode is connected to another terminal of the secondary winding of the isolated transformer and a source of the power switch tube. An anode of the fourth diode is connected to the one terminal of the secondary winding of the isolated transformer, and a cathode of the fourth diode is connected to a gate of the power switch tube. An emitter of the PNP-type BJT is connected to the cathode of the fourth diode, and a base of the PNP-type BJT is connected to the anodes of the second and the third diodes. An anode of the fifth diode is connected to a collector of the PNP-type BJT, and a cathode of the fifth diode is connected to the another terminal of the secondary winding of the isolated transformer.

In an exemplary embodiment of the invention, in case that secondary processing circuit includes second to fifth diodes, the voltage-regulator diode and the PNP-type BJT, the anti-circuit may further includes a first resistor connected between the first terminal of the primary input interface and the cathode of the first diode. Moreover, the secondary processing circuit may further includes a second resistor connected between the collector of the PNP-type BJT and the anode of the fifth diode.

In an exemplary embodiment of the invention, the power switch tube may be implemented by a power MOSFET, and the voltage-regulator diode may be implemented by a Zener diode.

In an exemplary embodiment of the invention, the isolated gate driver is at least adapted for a PWM-based switching power supply, for example, a flyback switching power supply, a forward switching power supply, a half-bridge switching power supply, etc., but not limited thereto.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
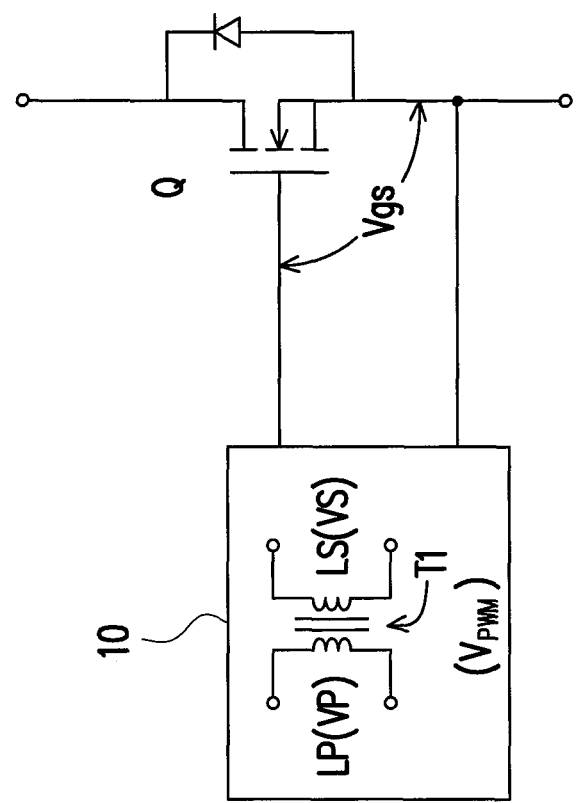
FIG. 1 is a diagram of a conventional isolated gate driver 10.

Reference will now be made in detail to the present preferred embodiments of the invention, examples of which are illustrated in the accompanying drawings. Wherever possible, the same reference numbers are used in the drawings and the description to refer to the same or like parts.

Figure 2:
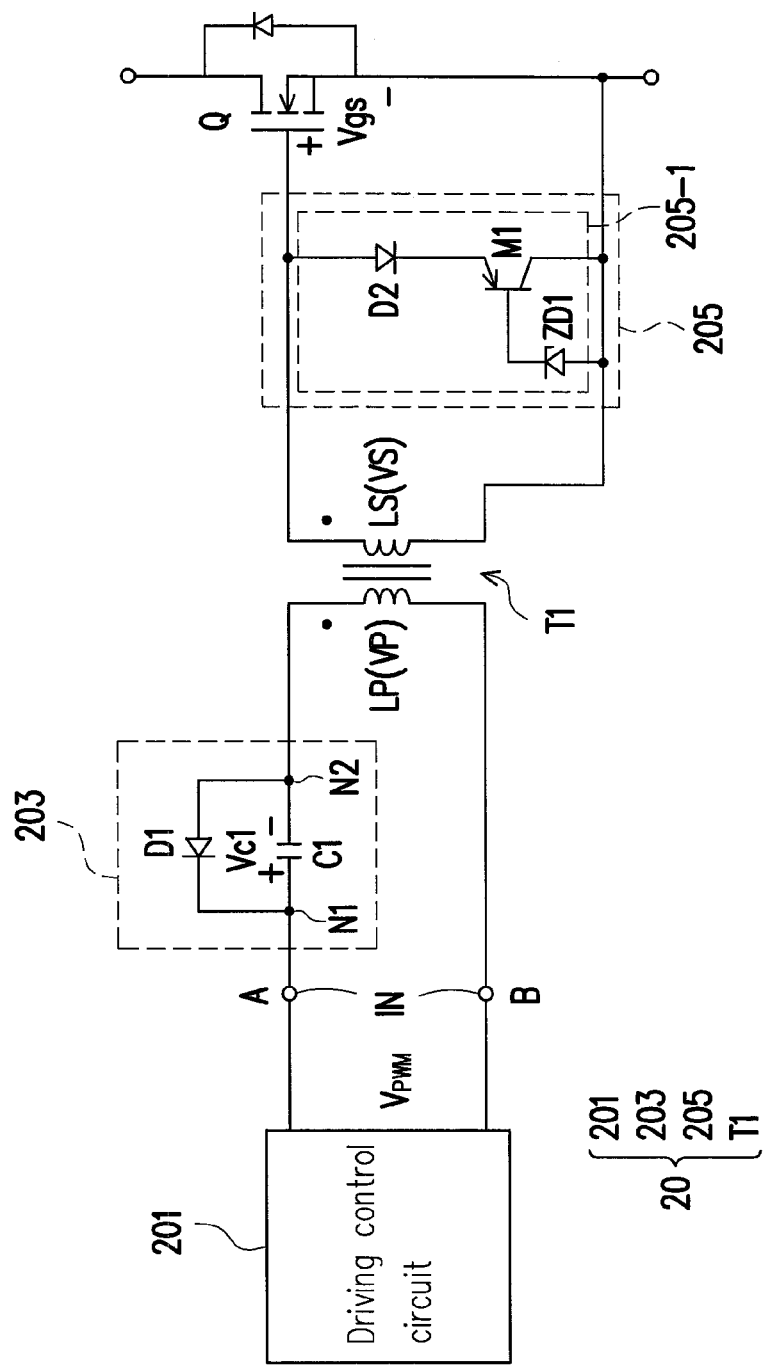
FIG. 2 is a diagram of an isolated gate driver 20 according to an exemplary embodiment of the invention.

FIG. 2 is a diagram of an isolated gate driver 20 according to an exemplary embodiment of the invention. Referring to FIG. 2, the isolated gate driver 20 includes a driving control circuit 201, an isolated transformer T1 having a primary winding LP and a secondary winding LS, an anti-circuit 203 and a secondary processing circuit 205. In this exemplary embodiment, the driving control circuit 201 is configured to generate a driving pulse-width-modulation (PWM) signal $V_{PWM}$ for driving a power switch tube Q, where the power switch tube Q may be implemented by a power MOSFET, but not limited thereto. Moreover, the turns ratio (LP/LS) of the isolated transformer T1 can be determined by the real design or requirement.

The anti-circuit 203 is connected between the driving control circuit 201 and the primary winding LP of the isolated transformer T1, and is configured to suppress the variation of the induced voltage VS in the secondary winding LS of the isolated transformer T1 when the duty cycle of the driving PWM signal $V_{PWM}$ is sharply/rapidly decreased. Moreover, the anti-circuit 203 is further configured to filter out the DC component of the driving PWM signal $V_{PWM}$.

In this exemplary embodiment, the driving PWM signal $V_{PWM}$ generated by the driving control circuit 201 would be provided to a primary input interface IN, and the anti-circuit 203 includes a diode D1 and a capacitor C1. An anode of the diode D1 is connected to one terminal (for example, the common-polarity terminal (i.e. dotted terminal)) of the primary winding LP of the isolated transformer T1, and a cathode of the diode D1 is connected to a first terminal A of the primary input interface IN. The capacitor C1 is connected in parallel with the diode D1, and another terminal (for example, the opposite-polarity terminal (i.e. non-dotted)) of the primary winding LP of the isolated transformer T1 is connected to a second terminal B of the primary input interface IN. It is noted that, in the other exemplary embodiments, the anti-circuit 203 can be changed to be connected between the second terminal B of the primary input interface IN and the opposite-polarity terminal of the primary winding LP of the isolated transformer T1. In other words, based on the real design/application, the anti-circuit 203 can be connected between 1) the first terminal A of the primary input interface IN and the common-polarity terminal of the primary winding LP of the isolated transformer T1, or between 2) the second terminal B of the primary input interface IN and the opposite-polarity terminal of the primary winding LP of the isolated transformer T1.

The secondary processing circuit 205 is connected in parallel with the secondary winding LS of the isolated transformer T1, and is configured to perform a voltage clamping action on the gate-source voltage (Vgs) of the power switch tube Q when the duty cycle of the driving PWM signal $V_{PWM}$ is sharply decreased. In this exemplary embodiment, the secondary processing circuit 205 includes a voltage clamping sub-circuit 205-1, and the voltage clamping sub-circuit 205-1 includes a diode D2, a PNP-type BJT (bipolar-junction-transistor) M1 and a voltage-regulator diode ZD1.

An anode of the diode D2 is connected to one terminal (for example, the common-polarity terminal (i.e. dotted terminal)) of the secondary winding LS of the isolated transformer T1 and a gate of the power switch tube Q. An emitter of the PNP-type BJT M1 is connected to a cathode of the diode D2, and a collector of the PNP-type BJT M1 is connected to another terminal (for example, the opposite-polarity terminal (i.e. non-dotted terminal)) of the secondary winding LS of the isolated transformer T1 and a source of the power switch tube Q. An anode of the voltage-regulator diode ZD1 is connect to the opposite-polarity terminal of the secondary winding LS of the isolated transformer T1, and a cathode of the voltage-regulator diode ZD1 is connected to a base of the PNP-type BJT M1. Obviously, the secondary winding LS of the isolated transformer T1 is connected in parallel with the gate-source of the power switch tube Q through the secondary processing circuit 205. In this exemplary embodiment, the voltage-regulator diode ZD1 may be implemented by a Zener diode, but not limited thereto. It is noted that, in the practice application, the secondary processing circuit 205 only needs to be connected to the gate of the power switch tube Q, and connected across the secondary winding LS of the isolated transformer T1.

In this exemplary embodiment, if the driving PWM signal $V_{PWM}$ is a unipolar signal, then the driving PWM signal $V_{PWM}$ has the DC component. Accordingly, the anti-circuit 203 would filter out the DC component of the driving PWM signal $V_{PWM}$ to obtain the AC components of the driving PWM signal $V_{PWM}$, so as to prevent that the isolated transformer T1 enters the saturation status under the DC magnetic biasing.

When the duty cycle of the driving PWM signal $V_{PWM}$ generated from the driving control circuit 201 is rapidly/sharply decreased, the capacitor C1 and the primary winding LP of the isolated transformer T1 form a resonant circuit. At the beginning of the resonance generated by the capacitor C1 and the primary winding LP of the isolated transformer T1, the positive (+) of the voltage Vc1 on the capacitor C1 is at the node N1, and the negative (−) of the voltage Vc1 on the capacitor C1 is at the node N2, such that the diode D1 is cut off.

When the polarity of the voltage Vc1 on the capacitor C1 is changed (i.e. the positive (+) of the voltage Vc1 on the capacitor C1 is at the node N2, and the negative (−) of the voltage Vc1 on the capacitor C1 is at the node N1) in response to the resonance generated by the capacitor C1 and the primary winding LP of the isolated transformer T1, and the voltage on the node N2 is greater than or equal to that of the node N1 for the forward bias voltage of the diode D1, the diode D1 is conducted. Accordingly, the conducted diode D1 would make that the voltage Vc1 of two terminals of the capacitor C1 is clamped to the forward bias voltage of the diode D1 (for example, 0.7V, but not limited thereto).

In this case, the induced voltage VP in the primary winding LP of the isolated transformer T1 is limited to (Vcc1+0.7)V, where Vcc1 is the amplitude of the driving PWM signal $V_{PWM}$. Accordingly, the variation of the induced voltage VS in the secondary winding LS of the isolated transformer T1 is suppressed (i.e. the induced voltage VS is lower), so as to make sure that the induced voltage VS in the secondary winding LS of the isolated transformer T1 is lower than the maximum gate-source voltage (Vgs_max) of the power switch tube Q. Moreover, the amplitude of the induced voltage VS in the secondary winding LS of the isolated transformer T1 would be suppressed in response to the limited induced voltage VP in the primary winding LP of the isolated transformer T1, so the power switch tube Q can be reliably turned off in response to the disabled (i.e. low-level) driving PWM signal $V_{PWM}$ generated by the driving control circuit 201.

Figure 3:
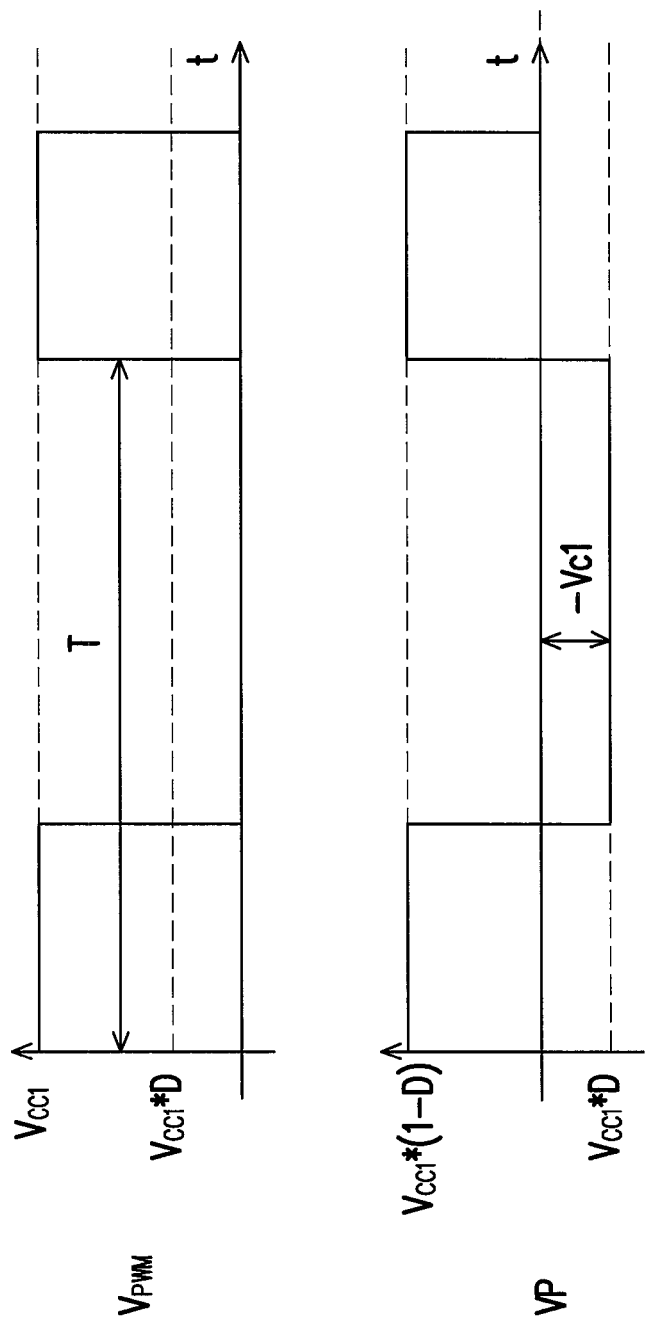
FIG. 3 is a part of driving waveforms ($V_{PWM}$, VP) of the isolated gate driver 20 of FIG. 2.

On the other hand, as shown in FIG. 3, under the isolated gate driver 20 is in the stable state, assuming that the period of the driving PWM signal $V_{PWM}$ is T, the duty cycle of the driving PWM signal $V_{PWM}$ is D, the amplitude of the driving PWM signal $V_{PWM}$ is Vcc1, and the turns ratio (LP/LS) of the isolated transformer T1 is 1:1, so the voltage Vc1 on the capacitor C1 is (D*Vcc1). Moreover, when the driving PWM signal $V_{PWM}$ is in the high-level, the induced voltage VP in the primary winding LP of the isolated transformer T1 is also in the high-level, such that the high-level of the induced voltage VP in the primary winding LP of the isolated transformer T1 is (Vcc1−Vc1), namely, Vcc1*(1−D).

In this case, if the isolated gate driver 20 does not have the secondary processing circuit 205, and when the duty cycle (D) of the driving PWM signal $V_{PWM}$ is very small, the induced voltage VS in the secondary winding LS of the isolated transformer T1 may be greater than the maximum gate-source voltage (Vgs_max) of the power switch tube Q, such that the power switch tube Q may be damaged. However, if the isolated gate driver 20 does have the secondary processing circuit 201, and when the duty cycle (D) of the driving PWM signal $V_{PWM}$ is very small, the induced voltage VS in the secondary winding LS of the isolated transformer T1 is suppressed by the voltage-clamping sub-circuit 205-1 of the secondary processing circuit 205, so as to make sure that the induced voltage VS in the secondary winding LS of the isolated transformer T1 is lower than the maximum gate-source voltage (Vgs_max) of the power switch tube Q, such that the power switch tube Q is operated in the safety situation.

In this exemplary embodiment, the value ($V_{ZD1}$) of the voltage-regulator diode ZD1 (i.e. the Zener diode) can be a predetermined value approximately lower than the maximum gate-source voltage (Vgs_max) of the power switch tube Q, for example, (Vgs_max−0.7V), but not limited thereto. Accordingly, when the induced voltage VP in the primary winding LP of the isolated transformer T1 is greater than the predetermined value $V_{ZD1}$ (VP>$V_{ZD1}$), the PNP-type BJT M1 is turned on to be served as a bypass branch of the voltage-regulator diode ZD1.

In the same assuming conditions above, when the driving PWM signal $V_{PWM}$ is in the low-level, the induced voltage VP in the primary winding LP of the isolated transformer T1 is also in the low-level, such that the low-level of the induced voltage VP in the primary winding LP of the isolated transformer T1 is −Vc1, namely, −(Vcc1*D). Obviously, the isolated gate driver 20 can generate an inverse gate driving voltage to turn off the power switch tube Q, so the isolated gate driver 20 has the strong anti-interference ability.

Figure 4:
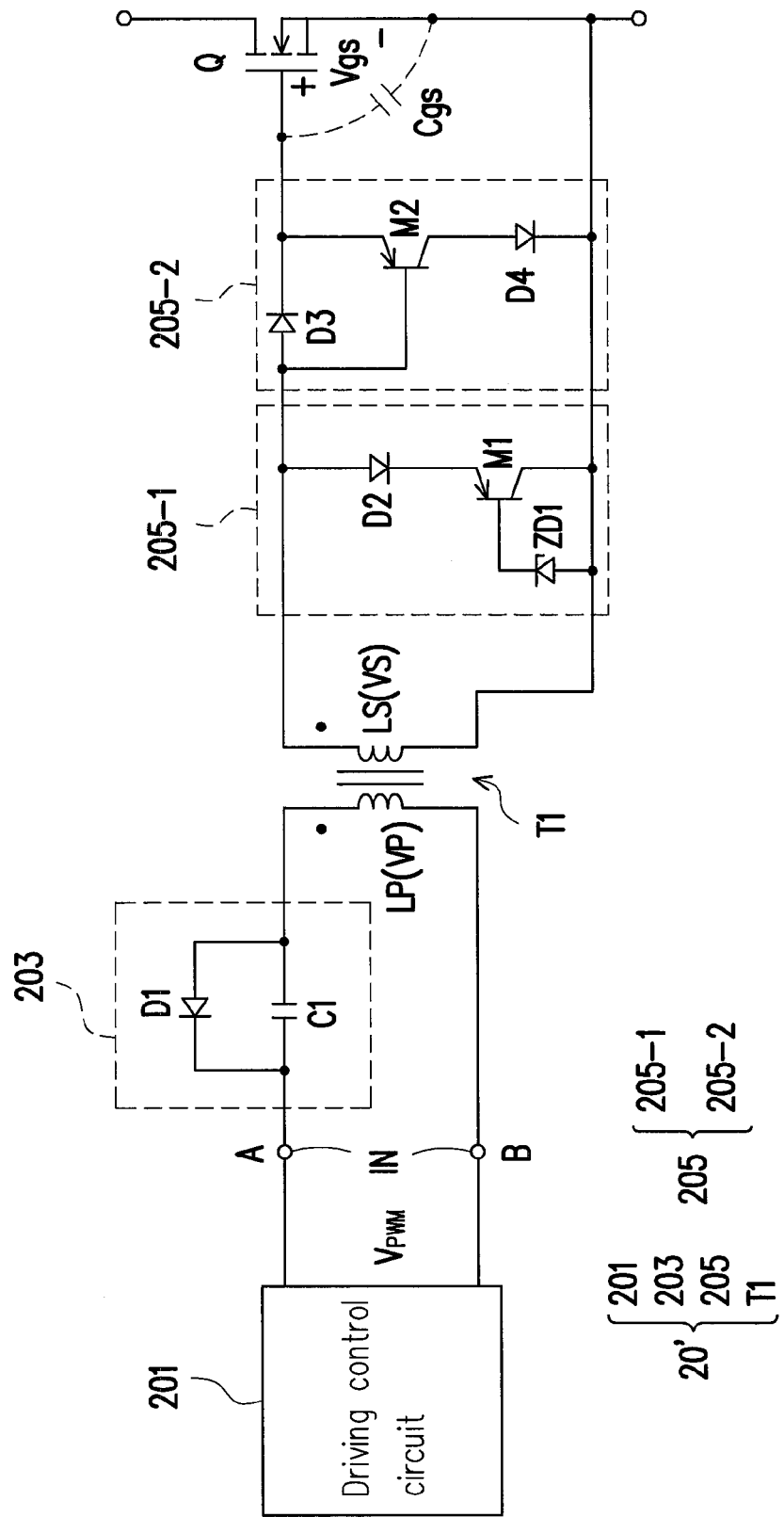
FIG. 4 is a diagram of an isolated gate driver 20' according to another exemplary embodiment of the invention.

FIG. 4 is a diagram of an isolated gate driver 20' according to another exemplary embodiment of the invention. Referring to FIGS. 2 and 4, as shown in FIG. 4, the parasitic capacitor Cgs between the gate and the source of the power switch tube Q is generally very large, so the power switch tube Q would be slowly turned off by the isolated gate driver 20, and thus generating the larger turn-off losses. In order to solve such problem, a discharging sub-circuit 205-2 is additionally added the secondary processing circuit 205 into the isolated gate driver 20'.

In this exemplary embodiment, the discharging sub-circuit 205-2 includes diodes (D3, D4) and a PNP-type BJT M2. An anode of the diode D3 is connected to the anode of the diode D2, and a cathode of the diode D3 is connected to the gate of the power switch tube Q. An emitter of the PNP-type BJT M2 is connected to the cathode of the diode D3, and a base of the PNP-type BJT M2 is connected to the anode of the diode D3. An anode of the diode D4 is connected to a collector of the PNP-type BJT M2, and a cathode of the diode D4 is connected to the opposite-polarity terminal (i.e. non-dotted terminal) of the secondary winding LS of the isolated transformer T1.

In this exemplary embodiment, the discharging sub-circuit 205-2 is inactivated when the power switch tube Q is turned on; moreover, the discharging sub-circuit 205-2 is activated when the power switch tube Q is turned off, so as to discharge charges stored in the parasitic capacitor Cgs between the gate and the source of the power switch tube Q.

To be specific, when the induced voltage VS in the secondary winding LS of the isolated transformer T1 is positive, the power switch tube Q is turned on, so the PNP-type BJT M2 is turned off due to the conducted diode D3. Therefore, the discharging sub-circuit 205-2 is inactivated. On the other hand, when the induced voltage VS in the secondary winding LS of the isolated transformer T1 is negative, the power switch tube Q is turned off, so the PNP-type BJT M2 is turned on due to the cut-off diode D3 (at this time, the voltage difference between two terminals of the diode D3 is VS−Vgs). Therefore, the discharging sub-circuit 205-2 is activated, such that the charges stored in the parasitic capacitor Cgs between the gate and the source of the power switch tube Q can be rapidly discharged through the discharging path of the PNP-type BJT M2 and the diode D4, and thus rapidly turning off the power switch tube Q and reducing the turn-off losses. It is noted that the reverse-conduction of the PNP-type BJT M2 can be prevented by the diode D3, so as to avoid the PN configuration between the base and the emitter of the PNP-type BJT M2 from reverse-breakdown.

Figure 5:
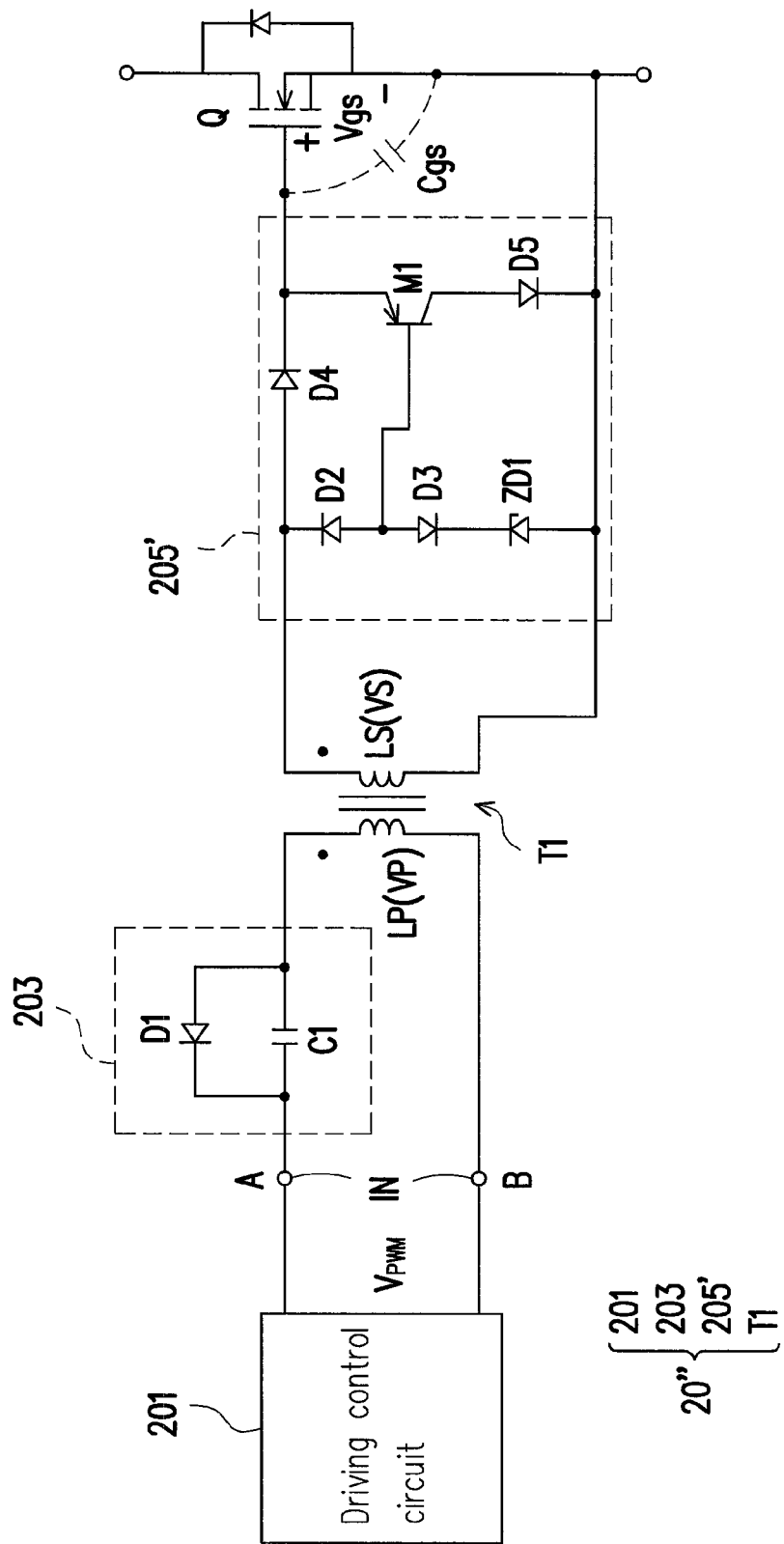
FIG. 5 is a diagram of an isolated gate driver 20" according to another exemplary embodiment of the invention.

FIG. 5 is a diagram of an isolated gate driver 20" according to another exemplary embodiment of the invention. Referring to FIGS. 4 and 5, the difference between the isolated gate drivers 20' and 20" is that the configuration of the secondary processing circuit 205' of the isolated gate driver 20" is different that of the secondary processing circuit 205 of the isolated gate driver 20'. To be specific, the configuration of the secondary processing circuit 205' of the isolated gate driver 20" can be seen as the simple configuration of the secondary processing circuit 205 of the isolated gate driver 20'.

In this exemplary embodiment, the secondary processing circuit 205' includes diodes D2-D5, a voltage-regulator diode ZD1 and a PNP-type BJT M1. A cathode of the diode D2 is connected to one terminal (for example, the common-polarity terminal (i.e. dotted terminal)) of the secondary winding LS of the isolated transformer T1. An anode of the diode D3 is connected to an anode of the diode D2. A cathode of the voltage-regulator diode ZD1 is connected to a cathode of the diode D3, and an anode of the voltage-regulator diode ZD1 is connected to another terminal (for example, the opposite-polarity terminal (i.e. non-dotted terminal)) of the secondary winding LS of the isolated transformer T1 and the source of the power switch tube Q.

An anode of the diode D4 is connected to the common-polarity terminal (i.e. dotted terminal) of the secondary winding LS of the isolated transformer T1, and a cathode of the diode D4 is connected to the gate of the power switch tube Q. An emitter of the PNP-type BJT M1 is connected to the cathode of the diode D4, and a base of the PNP-type BJT M1 is connected to the anodes of the diodes (D2, D3). An anode of the diode D5 is connected to a collector of the PNP-type BJT M1, and a cathode of the diode D5 is connected to the opposite-polarity terminal (i.e. non-dotted terminal) of the secondary winding LS of the isolated transformer T1. Similarly, in the practice application, the secondary processing circuit 205' only needs to be connected to the gate of the power switch tube Q, and connected across the secondary winding LS of the isolated transformer T1.

In this exemplary embodiment, when the induced voltage VS in the secondary winding LS of the isolated transformer T1 is positive, the power switch tube Q is turned on, so the diode D2 is cut off and the diode D4 is conducted. In this case, when the gate-source voltage (Vgs) of the power switch tube Q is greater than ($V_{ZD1}$+0.7)V, where $V_{ZD1}$ is the value of the voltage-regulator diode ZD1 (i.e. the Zener diode), the voltage-regulator diode ZD1 is activated, the diode D3 is conducted, and the PNP-type BJT M1 is turned on, such that the gate-source voltage (Vgs) of the power switch tube Q is limited to ($V_{ZD1}$+1.4)V, and thus achieving the purpose of secondary voltage clamping.

On the other hand, when the induced voltage VS in the secondary winding LS of the isolated transformer T1 is negative, the power switch tube Q is turned off, so the diode D2 is conducted and the PNP-type BJT M1 is turned on, such that the charges stored in the parasitic capacitor Cgs between the gate and the source of the power switch tube Q can be rapidly discharged through the discharging path of the PNP-type BJT M1 and the diode D5, and thus rapidly turning off the power switch tube Q and reducing the turn-off losses. Similarly, the reverse-conduction of the PNP-type BJT M1 can be avoided by the diode D4, so as to avoid the PN configuration between the base and the emitter of the PNP-type BJT M1 from reverse-breakdown. Obviously, the isolated gate driver 20" can achieve the similar technical efficiency as the isolated gate driver 20'.

Figure 6:
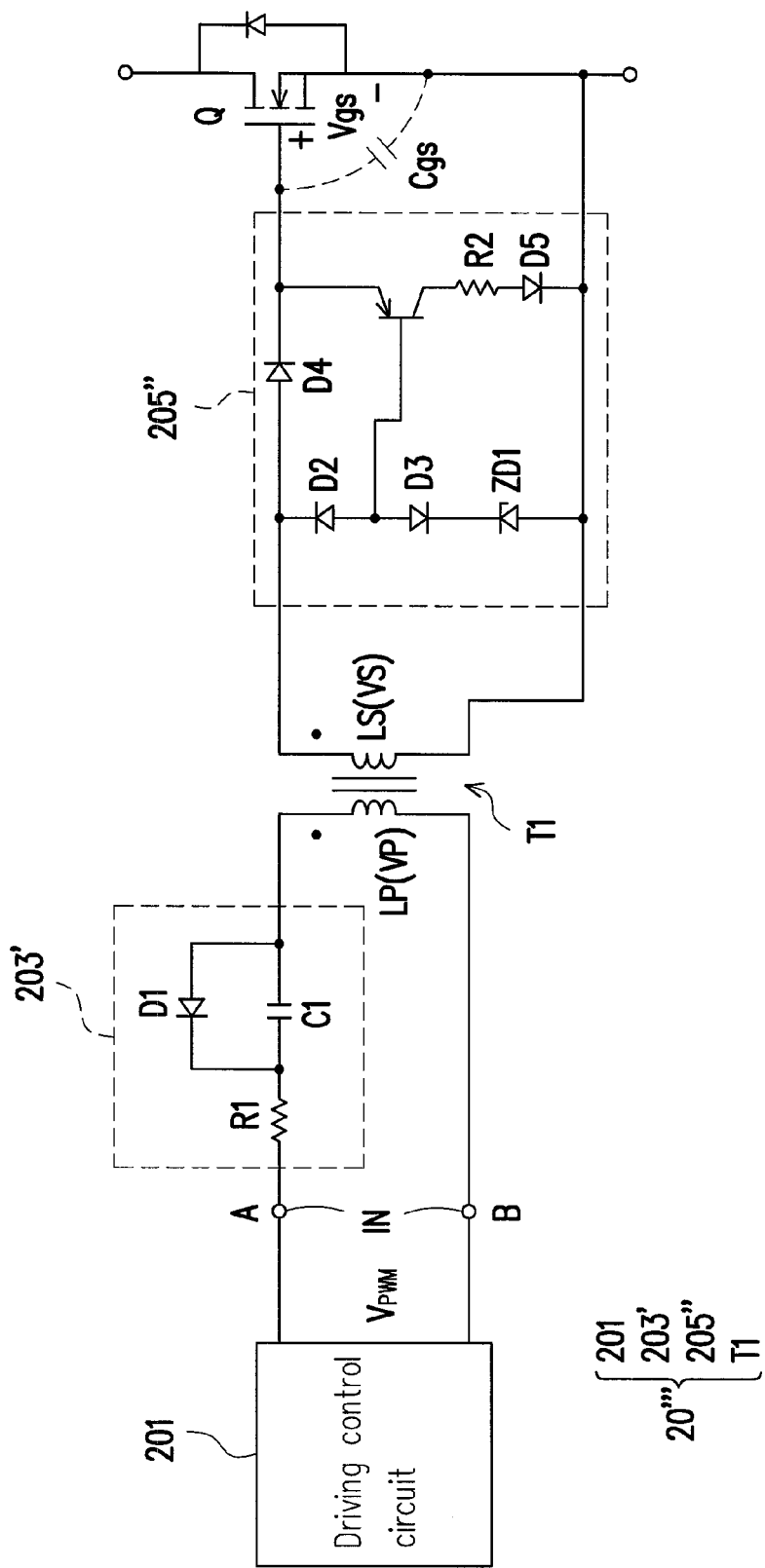
FIG. 6 is a diagram of an isolated gate driver 20''' according to another exemplary embodiment of the invention.

FIG. 6 is a diagram of an isolated gate driver 20''' according to another exemplary embodiment of the invention. Referring to FIGS. 5 and 6, the difference between the isolated gate drivers 20" and 20''' is that the configuration of the anti-circuit 203' of the isolated gate driver 20''' is different that of the anti-circuit 203 of the isolated gate driver 20". Moreover, the configuration of the secondary processing circuit 205" of the isolated gate driver 20''' is different that of the secondary processing circuit 205' of the isolated gate driver 20".

To be specific, the anti-circuit 203' further includes a resistor R1 than the anti-circuit 203; and the secondary processing circuit 205" further includes a resistor R2 than the secondary processing circuit 205'. The resistor R1 is connected between the first terminal A of the primary input interface IN and the cathode of the diode D1. Moreover, the resistor R2 is connected between the collector of the PNP-type BJT M1 and the anode of the diode D5.

In this exemplary embodiment, the resistor R1 is configured to adjust the turn-on speed of the power switch tube Q, and to achieve the purpose of current limiting under the voltage-regulator diode ZD1 is activated to perform the voltage clamping. Moreover, the resistor R2 is configured to adjust the turn-off speed of power switch tube Q.

It is noted that, the isolated gate drivers (20, 20', 20", 20''') of the above exemplary embodiments can prevent that when the duty cycle (D) of the driving PWM signal $V_{PWM}$ is sharply/rapidly decreased to 0%, the induced voltage VS in the secondary winding LS of the isolated transformer T1 is over or greater than the maximum gate-source voltage (Vgs) of the high power MOSFET Q in case that the induced voltage VS in the secondary winding LS of the isolated transformer T1 is affected by the resonance generated by the capacitor C1 and the primary winding LP of the isolated transformer T1, and the polarity of the voltage Vc1 on the capacitor C1 is changed with the resonance oscillation.

In summary, the isolated gate drivers (20, 20', 20", 20''') of the above exemplary embodiments at least have the following advantages:

1. The driving speed is fast due to applying the isolated transformer (T1) and the small delay time;

2. The power switch tube (Q) can be reliably driven under the wide duty cycle range;

3. The dead zone and the false turn on of the power switch tube (Q) during the deadlock cycle of the driving control circuit (201) can be prevented;

4. The anti-interference ability is strong; and

5. The bias source and the active elements are omitted, so the circuit configuration is very simple and the reliability is high, such that it can be widely applied in or adapted for any PWM-based switching power supplies under the isolation of controlling and driving, for example, a flyback switching power supply, a forward switching power supply, a half-bridge switching power supply, etc., but not limited thereto.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An isolated gate driver, comprising:
a driving control circuit, configured to generate a driving pulse-width-modulation (PWM) signal for driving a power switch tube;
an isolated transformer, having a primary winding and a secondary winding;
an anti-circuit, connected between the driving control circuit and the primary winding of the isolated transformer, the anti-circuit comprising a first diode and a capacitor which is clamped to a forward bias voltage of the first diode, and configured to suppress a variation of an induced voltage in the secondary winding of the isolated transformer when a duty cycle of the driving PWM signal is sharply decreased, wherein the first diode and the capacitor are connected in parallel; and
a secondary processing circuit, connected in parallel with the secondary winding of the isolated transformer, configured to perform a voltage clamping action on a gate-source voltage of the power switch tube when the duty cycle of the driving PWM signal is sharply decreased.

2. The isolated gate driver according to claim 1, wherein the driving PWM signal is provided to a primary input interface,
wherein an anode of the first diode is connected to one terminal of the primary winding of the isolated transformer, and a cathode of the first diode is connected to a first terminal of the primary input interface,
wherein another terminal of the primary winding of the isolated transformer is connected to a second terminal of the primary input interface.

3. The isolated gate driver according to claim 2, wherein the anti-circuit is further configured to filter out a DC component of the driving PWM signal.

4. The isolated gate driver according to claim 2, wherein the secondary processing circuit comprises:
a voltage clamping sub-circuit, comprising:
a second diode, having an anode connected to the one terminal of the secondary winding of the isolated transformer and a gate of the power switch tube;
a first PNP-type BJT, having an emitter connected to a cathode of the second diode, and a collector connected to another terminal of the secondary winding of the isolated transformer and a source of the power switch tube; and
a voltage-regulator diode, having an anode connected to the another terminal of the secondary winding of the isolated transformer, and a cathode connected to a base of the first PNP-type BJT.

5. The isolated gate driver according to claim 4, wherein the voltage-regulator diode at least comprises a Zener diode.

6. The isolated gate driver according to claim 4, wherein the secondary processing circuit further comprises:
a discharging sub-circuit, comprising:
a third diode, having an anode connected to the anode of the second diode, and a cathode connected to the gate of the power switch tube;
a second PNP-type BJT, having an emitter connected to the cathode of the third diode, and a base connected to the anode of the third diode; and
a fourth diode, having an anode connected to a collector of the second PNP-type BJT, and a cathode connected to the another terminal of the secondary winding of the isolated transformer.

7. The isolated gate driver according to claim 6, wherein:
the discharging sub-circuit is inactivated when the power switch tube is turned on; and
the discharging sub-circuit is activated when the power switch tube is turned off, so as to discharge charges stored in a parasitic capacitor between the gate and the source of the power switch tube.

8. The isolated gate driver according to claim 6, wherein the voltage-regulator diode at least comprises a Zener diode.

9. The isolated gate driver according to claim 2, wherein the secondary processing circuit comprises:
a second diode, having a cathode connected to one terminal of the secondary winding of the isolated transformer;
a third diode, having an anode connected to an anode of the second diode;
a voltage-regulator diode, having a cathode connected to a cathode of the third diode, and an anode connected to another terminal of the secondary winding of the isolated transformer and a source of the power switch tube;
a fourth diode, having an anode connected to the one terminal of the secondary winding of the isolated transformer, and a cathode connected to a gate of the power switch tube;
a PNP-type BJT, having an emitter connected to the cathode of the fourth diode, and a base connected to the anodes of the second and the third diodes; and
a fifth diode, having an anode connected to a collector of the PNP-type BJT, and a cathode connected to the another terminal of the secondary winding of the isolated transformer.

10. The isolated gate driver according to claim 9, wherein the anti-circuit further comprises:
a first resistor, connected between the first terminal of the primary input interface and the cathode of the first diode.

11. The isolated gate driver according to claim 10, wherein the secondary processing circuit further comprises:
a second resistor, connected between the collector of the PNP-type BJT and the anode of the fifth diode.

12. The isolated gate driver according to claim 9, wherein the voltage-regulator diode at least comprises a Zener diode.

13. The isolated gate driver according to claim 1, wherein the power switch tube is implemented by a power MOSFET.

14. The isolated gate driver according to claim 1, wherein the isolated gate driver is at least adapted for a PWM-based switching power supply.

* * * * *